United States Patent
Kim et al.

[11] Patent Number: 5,929,691
[45] Date of Patent: Jul. 27, 1999

[54] MODE SETTING CIRCUIT FOR A MEMORY DEVICE

[75] Inventors: San-hong Kim; Seung-keun Lee, both of Seoul, Rep. of Korea

[73] Assignee: Samsung Eelectronics, Co., Ltd., Suwon, Rep. of Korea

[21] Appl. No.: 08/879,900

[22] Filed: Jun. 19, 1997

[30] Foreign Application Priority Data

Jun. 19, 1996 [KR] Rep. of Korea .................. 96-22349

[51] Int. Cl.$^6$ ................................................. H01H 37/76
[52] U.S. Cl. ........................ 327/525; 365/96; 365/225.7
[58] Field of Search ................................ 327/525, 544, 327/545; 365/96, 225.7

[56] References Cited

U.S. PATENT DOCUMENTS

| | | | |
|---|---|---|---|
| 4,935,899 | 6/1990 | Morigami | 365/200 |
| 4,996,672 | 2/1991 | Kim | 365/225.7 |
| 5,345,110 | 9/1994 | Renfro et al. | 327/525 |
| 5,361,001 | 11/1994 | Stolfa | 327/525 |
| 5,446,402 | 8/1995 | Yoshimori | 327/525 |
| 5,539,692 | 7/1996 | Kajigaya et al. | 365/189.01 |
| 5,566,107 | 10/1996 | Gilliam | 327/525 |

Primary Examiner—Timothy P. Callahan
Assistant Examiner—Jung Ho Kim
Attorney, Agent, or Firm—Marger Johnson & McCollom, P.C.

[57] ABSTRACT

A mode setting circuit for a semiconductor memory device reduces power consumption and layout area by utilizing a complimentary pair of transistors to sense the state of a fuse. The fuse and complimentary pair of transistors are coupled in series between a power supply and ground. The gates of the transistors are coupled together to receive an input signal. An output signal is generated at a node between the pair of transistors. A latch is coupled to the node to latch the output signal. When the fuse is intact, the circuit generates the output signal responsive to the input signal. When the fuse is blown, the circuit maintains the output signal in a steady state.

6 Claims, 4 Drawing Sheets

MODE SETTING CIRCUIT FOR A MEMORY DEVICE

This application corresponds to Korean patent application No. 96-22349 filed Jun. 19, 1996 in the name of Samsung Electronics Co., Ltd., which is herein incorporated by reference for all purposes.

BACKGROUND OF THE INVENTION

1. Field of the Invention

This invention relates generally to mode setting circuits for memory devices, and more particularly to a mode setting circuit having reduced power consumption.

2. Description of the Related Art

In integrated circuits such as memory devices, a variety of circuit components for performing different operations are fabricated in the integrated circuit. This provides flexibility for selecting an optimal operation mode. After a memory chip is manufactured, it is tested to determine what functions are available in the chip, what operating characteristics the chip has, as well as various defects. This information is used to determine what operating modes can be utilized with the chip. Mode setting circuits on the chip are then used to optimize the chip by activating operational circuits, deactivating defective circuits and in other ways configuring and fixing the available circuit components so as to optimize the chip.

Such mode setting circuits help reduce the design period and thereby reduce the cost of integrated circuits. Two well known techniques for fixing the specific operation modes of a chip are the use of laser cut fuses and electrically cut fuses. With either laser or electrical fuses, the mode setting operation is carried out by either blowing a fuse or maintaining it intact.

FIGS. 1 and 2 illustrate the construction and operation of a mode setting circuit for a control block for EDO (extended data-out) in a semiconductor memory device. The EDO control block of FIG. 1 generates an output signal that enables or disables the EDO mode in accordance with the state of the fuse in the mode setting circuit.

FIGS. 3 and 4 illustrate the construction and operation of a prior art mode setting circuit, respectively, using a laser fuse. Referring to FIG. 3, a laser fuse 11 is connected between a power supply Vdd and a node N11. A p-type depletion mode MOS transistor 12 has a channel connected between node N11 and a power supply ground terminal GND. The gate of transistor 12 is connected to GND, and the transistor is in a normally conductive state. A capacitor 13 is connected between node N11 and GND. An n-type MOS transistor 15 has a channel connected between node N11 and GND. The gate of transistor 15 is connected to the output terminal of an inverter 14 which has an input terminal connected to node N11. A NOR gate 16 has a first input terminal connected to the output terminal of the inverter 14 and a second input terminal coupled to receive an input signal $\Phi A$. The output terminal of NOR gate is connected to the input terminal of an inverter 17 which has an output terminal that generates an output signal OUTA.

When laser fuse 11 is blown, depletion mode transistor 12 connects node N11 to GND and transistor 15 holds node N 11 at ground. The output signal OUTA is generated in response to the input signal $\Phi A$ and the state of the fuse. If laser fuse 11 is intact, node 11 remains high because it is connected to Vdd through fuse 11 which also charges capacitor 13. Thus, the input signal $\Phi A$ determines the logic level of the output signal OUTA. When the fuse is intact, the output signal OUTA is low when $\Phi A$ is low, and OUTA is high when $\Phi A$ is high as shown in FIG. 4.

If fuse 11 is blown by laser cutting, node N11 is held at GND so as to maintain the output of NOR gate 16 at a low level regardless of the state of the input signal $\Phi A$. That is, output signal OUTA is always high as shown in FIG. 4 when the fuse is cut.

However, since depletion mode transistor 12 is normally turned on, DC current flows from node N11 to ground resulting in excessive current consumption. The amount of current dissipated in a memory device having N mode setting circuits is N×IO, where IO is the amount of current flowing from node N11 to ground in the circuit of FIG. 3. Although the channel length of resistor 12 could be increased in order to reduce current consumption, this increases the layout size required for the mode setting circuit.

Accordingly, a need remains for a technique for reducing the power consumption of a mode setting circuit without increasing the layout size required for the circuit.

SUMMARY OF THE INVENTION

Therefore, it is an object of the present invention to reduce the power consumption of a mode setting circuit for a semiconductor memory device.

Another object of the present invention is to reduce the current consumption of a mode setting circuit without increasing the layout area required for the circuit.

To accomplish these and other objects, a mode setting circuit constructed in accordance with the present invention utilizes a complimentary pair of transistors to sense the state of a fuse. The fuse and complimentary pair of transistors are coupled in series between a power supply and ground. The gates of the transistors are coupled together to receive an input signal. An output signal is generated at a node between the pair of transistors. A latch is coupled to the node to latch the output signal. When the fuse is intact, the circuit generates the output signal responsive to the input signal. When the fuse is blown, the circuit maintains the output signal in a steady state.

One aspect of the present invention is a mode setting circuit comprising a fuse having a first terminal for receiving a first power supply signal, and a second terminal; and an input circuit having a first terminal coupled to the second terminal of the fuse, a second terminal for receiving a second power supply signal, a third terminal for receiving an input signal, and a fourth terminal for generating an output signal. The input circuit includes a complimentary pair of transistors.

Another aspect of the present invention is a fuse and means for generating an output signal responsive to an input signal and the state of the fuse. The means for generating an output signal includes a complimentary pair of transistors coupled between the fuse and a power supply terminal. The circuit can also include means for latching the output signal. The means for latching the output signal includes: an inverter having an input terminal and an output terminal; and a transistor having a first terminal coupled to the input terminal of the latch, a second terminal for receiving a power supply signal, and a third terminal coupled to the output terminal of the latch.

An advantage of the present invention is that it reduces the power consumption of a mode setting circuit for a semiconductor memory device.

Another advantage of the present invention is that it reduces the layout area required for a mode setting circuit.

The foregoing and other objects, features and advantages of the invention will become more readily apparent from the following detailed description of a preferred embodiment of the invention which proceeds with reference to the accompanying drawings.

DETAILED DESCRIPTION

Figure 1:
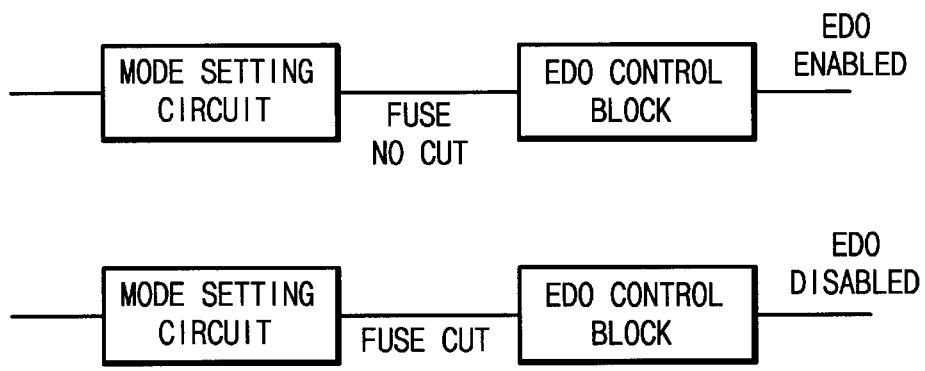
FIG. 1 is a block diagram of a prior art mode setting circuit and control block in a semiconductor memory device.
Figure 2:
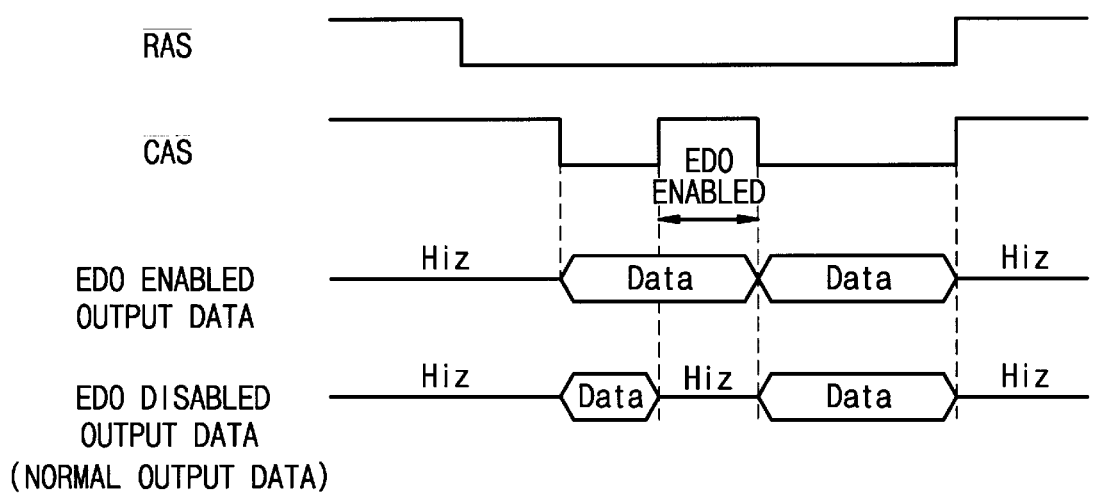
FIG. 2 is a timing diagram illustrating the operation of the circuit of FIG. 1.
Figure 3:
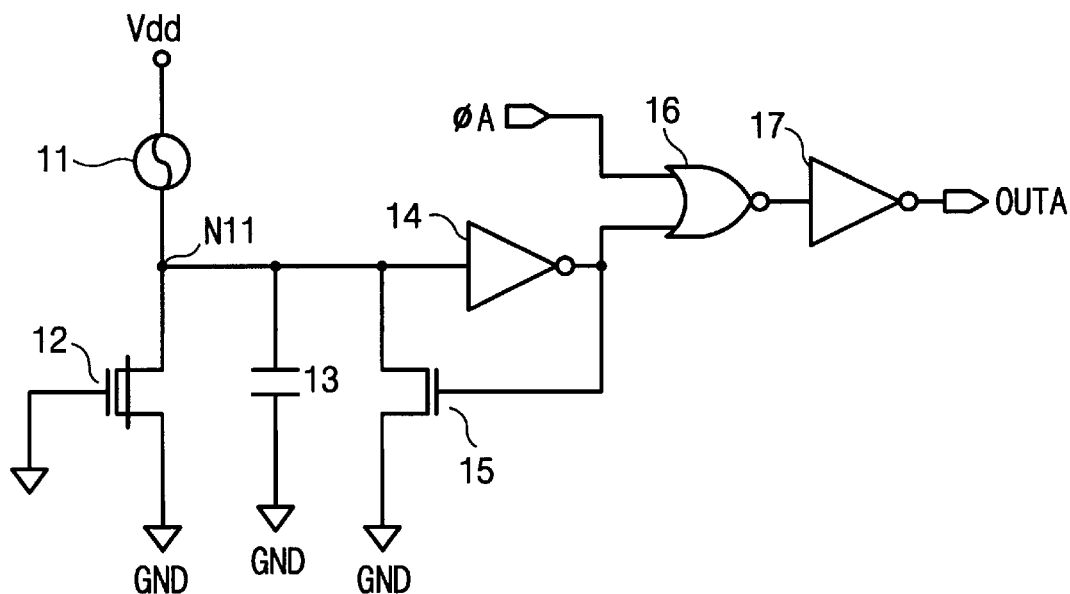
FIG. 3 is a schematic diagram of a prior art mode setting circuit.
Figure 4:
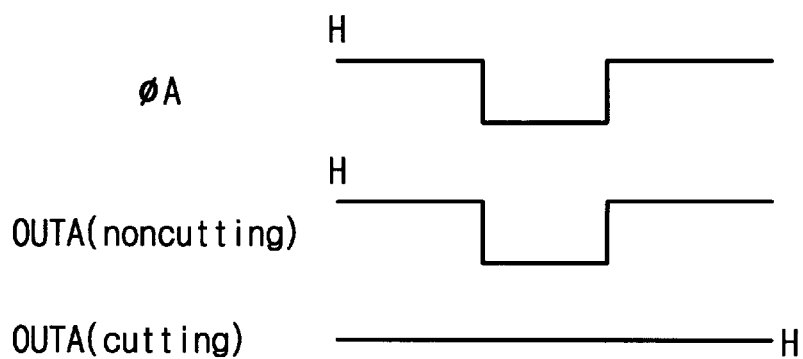
FIG. 4 is a timing diagram illustrating the operation of the circuit of FIG. 3.
Figure 5:
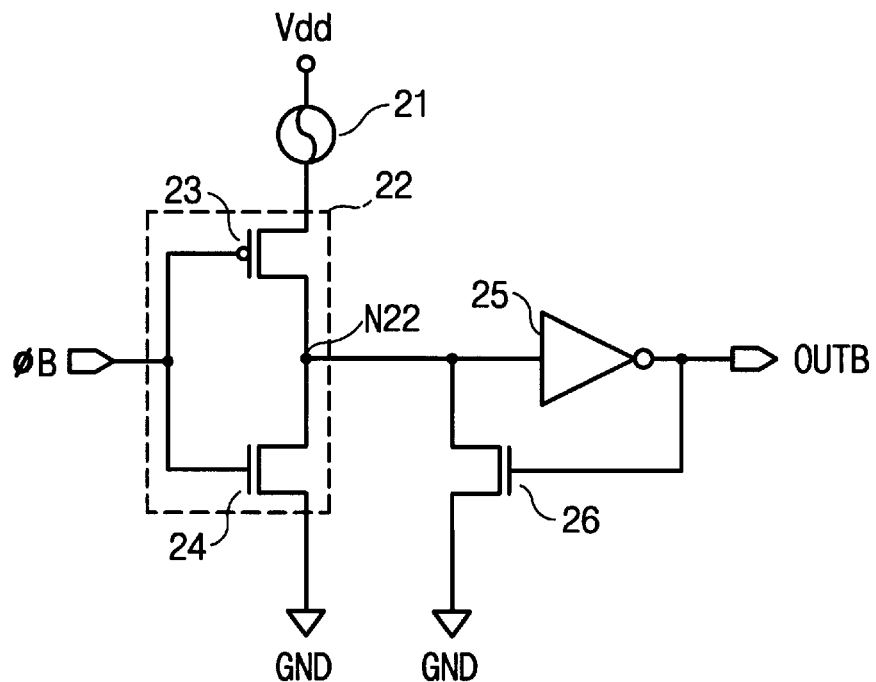
FIG. 5 is a schematic diagram of a first embodiment of a mode setting circuit constructed in accordance with the present invention.

FIG. 5 is a schematic diagram of a mode setting circuit constructed in accordance with the present invention. The circuit of FIG. 5 includes a laser fuse 21 which is connected between a power supply Vdd and an input circuit 22 which receives an input signal ΦB. Input circuit 22 is formed from a complementary pair of transistors including a PMOS transistor 23 which has a channel connected between a fuse and a node N22 and a gate connected to an input terminal for receiving the input signal ΦB. The complementary pair also includes an NMOS transistor 24 which has a channel connected between node N22 and a ground terminal GND. The gate of transistor 24 is connected to the gate of transistor 23. The circuit of FIG. 5 also includes a latch which is formed from an inverter which has an input terminal connected to node N22 and an output terminal for transmitting an output signal OUTB. The latch also includes an NMOS transistor 26 which has a channel connected between node N22 and GND and a gate connected to the output terminal of inverter 25.

Figure 6:
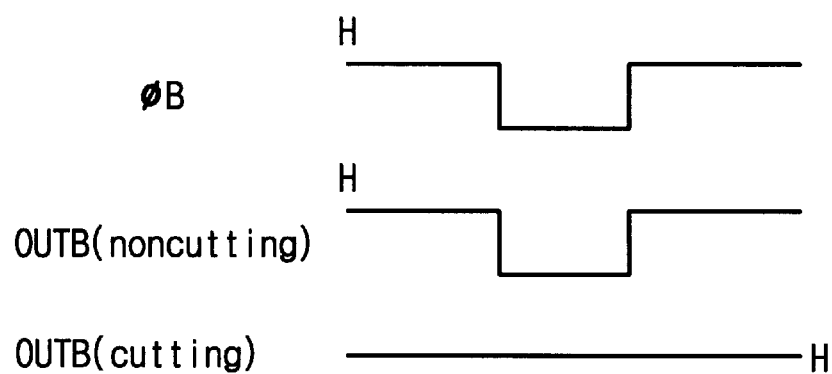
FIG. 6 is a timing diagram illustrating the operation of the circuit of FIG. 5.

The operation of the circuit of FIG. 5 which is useful for the transition condition when the input signal ΦB switches from low to high will now be described with reference to FIGS. 5 and 6. If fuse 21 is intact, the voltage of the output signal OUTB will follow that of the input signal ΦB. Namely, if the input signal ΦB is high when fuse 21 is intact, node N22 goes low and thus, the output signal OUTB goes high. Likewise, when the input signal ΦB is pulled low, the output signal OUTB goes low. Thus, the output signal OUTB is effective for determining a specific operating mode.

However, if fuse 21 is cut out, thereby isolating the input circuit 22 from the power supply Vdd, the output signal OUTB is maintained in a steady state condition at a high voltage by operation of the latch which includes inverter 25 and NMOS transistor 26.

Figure 7:
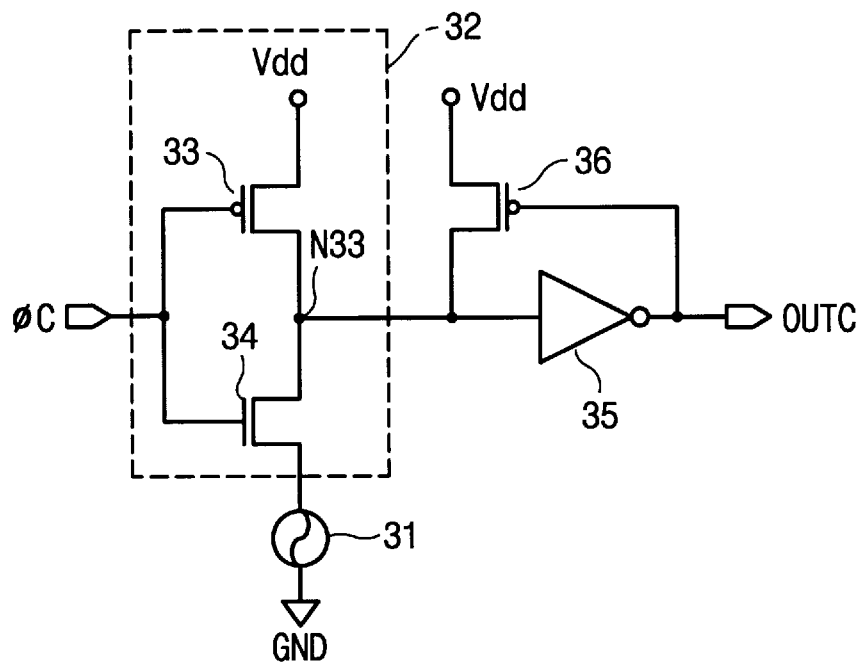
FIG. 7 is a schematic diagram of a second embodiment of a mode setting circuit constructed in accordance with the present invention.
Figure 8:
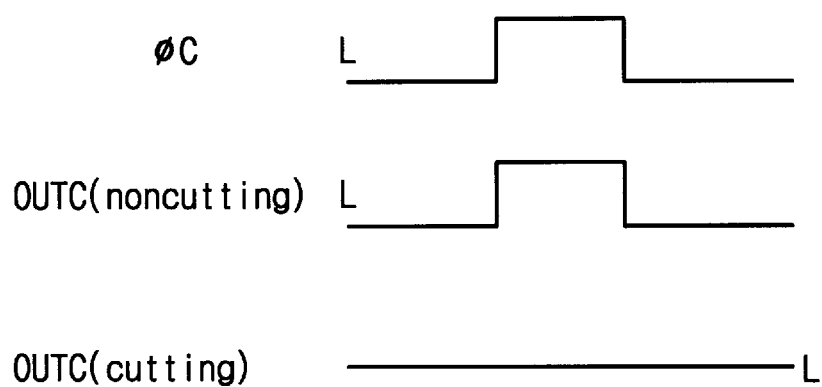
FIG. 8 is a timing diagram illustrating the operation of the circuit of FIG. 7

FIG. 7 is a schematic diagram of a second embodiment of a mode setting circuit constructed in accordance with the present invention. The circuit of FIG. 7 includes a laser fuse 31 which is connected between a power supply ground GND and an input circuit 31. The input circuit 31 includes a complementary pair of transistors 33 and 34. PMOS transistor 33 has a channel connected between a power supply Vdd and a node N33. NMOS transistor 34 has a channel connected between node N33 and the fuse 31. The gates of transistors 33 and 34 are connected together to receive an input ΦC. The circuit of FIG. 7 includes a latch formed from a PMOS transistor 36 and an inverter 35. The channel of transistor 36 is connected between the power supply Vdd and node N33. The input terminal of inverter 35 is connected to node N33 while the output terminal of inverter 35 is connected to the gate of transistor 36 and forms the output terminal for transmitting the output signal OUTC. The inverter 35 and transistor 36 function as a latch loop for holding the output signal in a stable state. The operation of the circuit of FIG. 7 which is useful when a high to low level transition on the input signal ΦC is the effective transition condition will now be described with reference to FIGS. 7 and 8. If fuse 31 is in tact, the voltage level of the output signal OUTC follows the voltage level of the input signal ΦC, and thus, the circuit is effective for activating a specific operation mode. However, if laser fuse 31 is cut, thereby isolating input circuit 32 from GND. The output signal OUTC is maintained in a steady state at a low voltage level so as to disable a circuit.

In both of the mode setting circuits of FIGS. 5 and 7, only one of the complementary transistors are activated at a given time, and thus there is no normally conductive DC current path. Thus, current consumption is reduced. As described above, the present invention offers significant advantages over prior art mode setting circuits because it reduces current consumption while simplifying and minimizing the construction of the circuit.

Having described and illustrated the principles of the invention in a preferred embodiment thereof, it should be apparent that the invention can be modified in arrangement and detail without departing from such principles. We claim all modifications and variations coming within the spirit and scope of the following claims.

We claim:

1. A mode setting circuit comprising:

a fuse having a first terminal for receiving a first power supply signal, and a second terminal; and an input circuit having a first terminal coupled to the second terminal of the fuse, a second terminal for receiving a second power supply signal, a third terminal for receiving an input signal, and a fourth terminal for generating an output signal;

wherein the input circuit includes:

a first transistor having a first terminal coupled to the second terminal of the fuse, a second terminal coupled to the fourth terminal of the input circuit, and a third terminal for receiving the input signal; and a second transistor having a first terminal for receiving the second power supply signal, a third terminal coupled to the third terminal of the first transistor, and a second terminal coupled to the second terminal of the first transistor such that only one of the first or second transistors are on at the same time.

2. A circuit according to claim 1 further including a latch having an input terminal coupled to the fourth terminal of the input circuit to latch the output signal.

3. A circuit according to claim 2 wherein the latch includes:

an inverter having an input terminal and an output terminal; and a transistor having a first terminal coupled to the input terminal of the latch, a second terminal for receiving the second power supply signal, and a third terminal coupled to the output terminal of the latch.

4. A circuit according to claim 1 wherein:

the first transistor is a MOS transistor having a channel coupled between its first and second terminals and a gate coupled to its third terminal;

the second transistor is a MOS transistor having a channel coupled between its first and second terminals and a gate coupled to its third terminal; and the gates of the first and second transistors are connected directly together.

5. A mode setting circuit comprising:

a fuse coupled to a first power supply terminal;

a first transistor having a channel coupled between the fuse and a node, and a gate coupled to receive an input signal;

a second transistor having a channel coupled between the node and a second power supply terminal, and a gate connected directly to the gate of the first transistor;

wherein the first and second transistors are complementary.

6. A circuit according to claim 5 further including a latch coupled to the node.

* * * * *